United States Patent
Xu et al.

(10) Patent No.: US 7,939,244 B2
(45) Date of Patent: May 10, 2011

(54) PHOTOSENSITIVE HARDMASK FOR MICROLITHOGRAPHY

(75) Inventors: Hao Xu, Rolla, MO (US); Ramil-Marcelo L. Mercado, Rolla, MO (US); Douglas J. Guerrero, Rolla, MO (US)

(73) Assignee: Brewer Science Inc., Rolla, MO (US)

( * ) Notice: Subject to any disclaimer, the term of this patent is extended or adjusted under 35 U.S.C. 154(b) by 213 days.

(21) Appl. No.: 12/386,594

(22) Filed: Apr. 21, 2009

(65) Prior Publication Data

US 2009/0297784 A1    Dec. 3, 2009

Related U.S. Application Data

(60) Provisional application No. 61/047,302, filed on Apr. 23, 2008.

(51) Int. Cl.
G03F 7/00    (2006.01)
G03F 7/004    (2006.01)
G03F 7/11    (2006.01)
G03F 7/38    (2006.01)
G03F 7/40    (2006.01)

(52) U.S. Cl. .......... 430/270.1; 430/271.1; 430/311; 430/322; 430/330; 430/331; 430/913; 430/927; 430/950

(58) Field of Classification Search ........ 430/270.1, 430/271.1, 311, 322, 330, 331, 913, 927, 430/950
See application file for complete search history.

(56) References Cited

U.S. PATENT DOCUMENTS

| | | | |
|---|---|---|---|
| 5,929,235 A | 7/1999 | Sato | |
| 6,900,134 B1* | 5/2005 | Shih et al. | 438/702 |
| 7,018,748 B2 | 3/2006 | Sebald et al. | |
| 7,070,914 B2 | 7/2006 | Neisser et al. | |
| 7,276,327 B2* | 10/2007 | Angelopoulos et al. | 430/325 |
| 7,341,939 B2* | 3/2008 | Oweyang et al. | 438/636 |
| 7,749,904 B2* | 7/2010 | Ho et al. | 438/672 |
| 7,824,837 B2* | 11/2010 | Wu et al. | 430/270.1 |
| 2003/0129531 A1 | 7/2003 | Oberlander et al. | |
| 2004/0185674 A1 | 9/2004 | M'Saad et al. | |
| 2005/0031964 A1* | 2/2005 | Babich et al. | 430/5 |
| 2005/0074699 A1 | 4/2005 | Sun et al. | |
| 2005/0255410 A1* | 11/2005 | Guerrero et al. | 430/311 |
| 2006/0035167 A1* | 2/2006 | Angelopoulos et al. | 430/270.1 |
| 2007/0117049 A1 | 5/2007 | Guerrero et al. | |
| 2008/0044772 A1* | 2/2008 | Guerrero et al. | 430/312 |
| 2008/0073754 A1 | 3/2008 | Zampini et al. | |
| 2008/0131815 A1* | 6/2008 | Kim et al. | 430/313 |
| 2009/0246958 A1* | 10/2009 | Burns et al. | 438/694 |
| 2009/0291389 A1* | 11/2009 | Allen et al. | 430/270.1 |
| 2010/0119972 A1* | 5/2010 | Houlihan et al. | 430/281.1 |

(Continued)

OTHER PUBLICATIONS

Hybrid Plastics, Inc. Material Safety Data Sheet for OctaTMA POSS, 3 pages.

(Continued)

*Primary Examiner* — Amanda C. Walke
(74) *Attorney, Agent, or Firm* — Hovey Williams LLP

(57) ABSTRACT

New hardmask compositions comprising non-polymeric, metal-containing nanoparticles dispersed or dissolved in a solvent system and methods of using those compositions as hardmask layers in microelectronic structures are provided. The compositions are photosensitive and capable of being rendered developer soluble upon exposure to radiation. The inventive hardmask layer is patterned simultaneously with the photoresist layer and provides plasma etch resistance for subsequent pattern transfer.

26 Claims, 5 Drawing Sheets
(2 of 5 Drawing Sheet(s) Filed in Color)

U.S. PATENT DOCUMENTS

| | | | | |
|---|---|---|---|---|
| 2010/0196825 A1* | 8/2010 | Huang et al. | | 430/286.1 |
| 2010/0255412 A1* | 10/2010 | Sun | | 430/5 |
| 2010/0261097 A1* | 10/2010 | Sun | | 430/5 |
| 2010/0273321 A1* | 10/2010 | Wang et al. | | 438/514 |
| 2010/0279234 A1* | 11/2010 | Yu et al. | | 430/324 |

OTHER PUBLICATIONS

Hybrid Plastics, Inc. Material Safety Data Sheet for DiSilanolIsobutyl-POSS, 3 pages.

Hybrid Plastics, Inc. Material Safety Data Sheet for TriSilanolEthyl-POSS, 3 pages.

Hybrid Plastics, Inc. Material Safety Data Sheet for TriSilanolIsooctyl POSS, 3 pages.

Hybrid Plastics, Inc. Material Safety Data Sheet for TetraSilanolPhenyl POSS, 3 pages.

Meador et al., "193-nm multilayer imaging systems," Proceedings of SPIE, vol. 5039, 2003, pp. 948-959.

Weimer et al., Materials for and performance of multilayer lithographic schemes, Proceedings of SPIE, vol. 6519, 2007, pp. 65192S1-65192S8.

Kim et al., "Silicon-based anti-reflective spin-on hardmask materials with improved storage stability for 193-nm lithography," Proceedings of SPIE, vol. 6519, 2007, pp. 65190-1-65190-10.

Written Opinion and Search Report dated Nov. 30, 2009, in corresponding PCT/US2009/041282.

Yamaoka et al., "Dual-mode Behavior of Vinyl Ether Functionalilzed Photoresist," J. Photopolym. Sci. Technol., vol. 7, No. 3, 1994, 533-536.

* cited by examiner (C)

(D)

PHOTOSENSITIVE HARDMASK FOR MICROLITHOGRAPHY

CROSS-REFERENCE TO RELATED APPLICATIONS

This application claims the priority benefit of a provisional application entitled PHOTOSENSITIVE HARDMASK FOR MICROLITHOGRAPHY, Ser. No. 61/047,302, filed Apr. 23, 2008, incorporated by reference herein.

BACKGROUND OF THE INVENTION

1. Field of the Invention

The present invention relates in general to compositions and microlithographic processes that allow use of extremely thin photoresist layers to form microelectronic structures.

2. Description of the Prior Art

The advances of microelectronic manufacture are reflected by the density and dimensions of semiconductor structures created by the microphotolithographic process. The demand for high density and small critical dimension (CD) has been constantly pushing photolithography technology to its limits. To keep pace with the semiconductor industry roadmap, next-generation patterning materials and innovative lithographic processes will be needed to work in unison for high-resolution lithography. As critical feature sizes keep shrinking to 32 nm and beyond, and while the aspect ratios of printed lines have certain limits to avoid possible line collapse, the use of a thin photoresist has been widely accepted to give better resolution and a large depth of focus (DOF). Rayleigh's law can be used to define the pattern resolution and depth of focus (DOF):

$$\text{Resolution} = k_1 \lambda / NA; \text{ and}$$

$$DOF = k_2 \lambda / NA^2,$$

where $\lambda$ is the irradiation wavelength, NA is the numerical aperture of the exposure tool, and $k_1$ and $k_2$ are constants for a given process. Rayleigh's theory indicates that an exposure tool with short wavelength and large numerical aperture will produce better pattern resolution. This principle is why the microelectronics industry has been progressively moving toward short exposure wavelengths. However, Rayleigh's law also shows that enhancing resolution causes the DOF to decrease. The use of a thin photoresist decreases the value of $k_1$ and increases the value of $k_2$, which results in better resolution and a large DOF. However, the reduced photoresist thickness cannot offer sufficient etch resistance to transfer the pattern into the substrate, especially for 193-nm ArF photolithography. Due to the transparency requirement, aromatic structures cannot be put into ArF resists, so most ArF resists etch even faster than previous photoresists. To solve this conflict between the need for ever-thinner photoresists for better resolution and the need for a sufficient etch budget for pattern transfer, only a few process and material solutions currently exist.

In one approach, silicon- or metal-containing hardmasks have been introduced into a multilayer etch stack to help provide a complete pattern transfer. Reactive ion etching (RIE) is typically used to open the hardmask layer under the photoresist. Clearly, the hardmask-to-photoresist etch selectivity determines how thin the photoresist can be. Unfortunately, almost all currently-available photoresists still etch relatively rapidly under common hardmask plasma etch chemistries. Thus, the photoresist still must be substantially thick for high-resolution lithography.

Another solution is to use a developer-soluble underlayer material to eliminate the otherwise required etch step. Isotropically developable and photosensitive bottom anti-reflective coatings have been described. However, undercutting is very difficult to control in an isotropically developable bottom anti-reflective coating. For a photosensitive, anisotropically developable bottom anti-reflective coating, a major concern is bottom anti-reflective coating clearance and CD uniformity when it is coated on substrate topography. On the other hand, if they are coated on top of a spin-on carbon (SOC) planarization layer, those organic bottom anti-reflective coating materials are not effective as hardmasks.

More recently, multiple exposure technology for the next printing node has become the only viable option until exposure wavelengths shorter than 193 nm, such as 13.5 nm, are available. Many process schemes for multiple exposure technology have been investigated and reported. Some schemes utilized a bright field mask where only small portions of the photoresist, such as lines, are protected from the exposure, while the remaining portion of the resist is exposed. The photoresist is then contacted with developer to remove the exposed portions of the resist, thereby leaving only the unexposed portion of the photoresist (i.e., the lines) remaining above the hardmask layer. The pattern is transferred to the hardmask by etching away the hardmask layer except for those areas underneath the unexposed portions of the photoresist. The process is repeated until the desired pattern is achieved. In a dark field exposure process, a large portion of the photoresist is protected from exposure, while only the small portions of the photoresist are exposed and removed after development. As with bright field, the pattern must then be transferred to the hardmask using an etching process.

Likewise, ArF immersion lithography, together with double patterning, offers a more realistic solution for 32-nm and 22-nm half-pitch node fabrications. However, the current litho-etch-litho-etch (LELE) process is very expensive, even in comparison to EUV lithography.

Thus, many existing processes still require a dry-etch step to transfer the patterns to the underlying layer. The dry-etch step complicates the process and increases the cost and time involved. Accordingly, there is a need in the art for protective materials that can be used as a hardmask layer and over planarization layers or in multiple exposure processes that eliminate the need for the etching step and permit the use of extremely thin photoresist layers for increased DOF and CD control. There is also a need for hardmask layers that can be used with ArF immersion lithography, together with double patterning.

SUMMARY OF THE INVENTION

The present invention overcomes these problems by broadly providing compositions for use in forming microelectronic structures, methods of forming such structures, and the structures thereof. The invention provides a hardmask composition that will decrease, or even eliminate, the required photoresist thickness and, in the meantime, shorten the process time by eliminating an etching step. In addition, the invention provides a material that can be applied simply by spin-coating, which requires less time and is less expensive compared to traditional silicon nitride/oxide chemical vapor deposition (CVD) processes. Further, the invention enables the continuous CD shrinking to the 32-nm node and beyond, especially when coupled with a multiple patterning process, while also reducing the cost of ownership of current multilayer fabrication by eliminating an etch step.

In more detail, a composition useful for forming microelectronic devices is provided. The composition comprises a non-polymeric nanoparticle dissolved or dispersed in the solvent system. Advantageously, the composition is developer soluble.

A method of forming a microelectronic structure is also provided. The method comprises providing a substrate having a surface. One or more intermediate layers are optionally formed on the substrate surface. A hardmask composition is applied adjacent the intermediate layers, if present, or adjacent the substrate surface if no intermediate layers are present. The hardmask composition comprises a non-polymeric nanoparticle dissolved or dispersed in a solvent system. The hardmask composition is baked to yield a hardmask layer on the intermediate layer(s) if present, or on the substrate surface if no intermediate layer(s) is present. The hardmask layer is exposed to radiation to yield an exposed portion of the hardmask layer. Advantageously, the hardmask layer is contacted with a developer so as to remove the exposed portion of the hardmask layer.

The invention also provides a microelectronic structure comprising a substrate having a surface, optionally one or more intermediate layer on the substrate surface, and a hardmask layer adjacent the intermediate layer(s), if present, or adjacent the substrate surface if no intermediate layer(s) is present. The hardmask layer comprises a crosslinked non-polymeric nanoparticle. Advantageously, the hardmask layer is developer soluble.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION OF THE PREFERRED EMBODIMENTS

The Inventive Compositions

Figure 1:
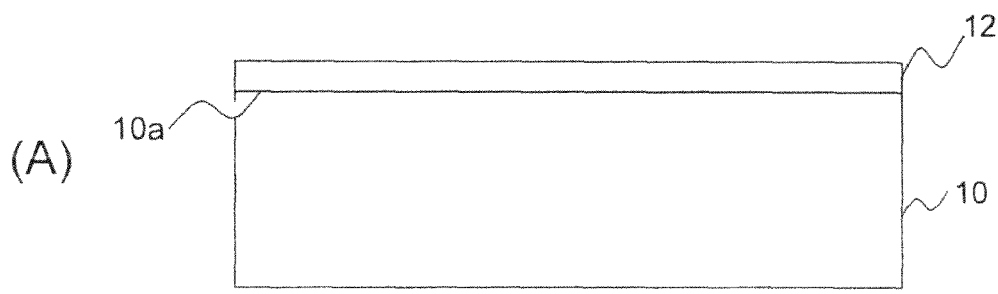
FIGS. 1(A)-(D) are schematic drawings depicting a structure (not to scale) formed by the inventive process.
Figure 1:
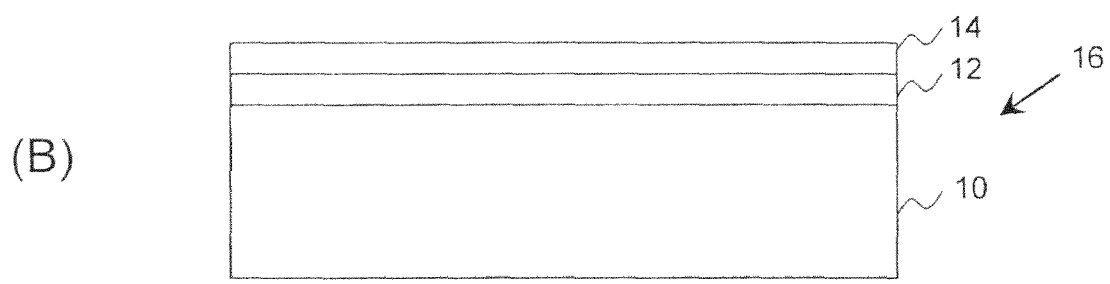
Figure 1:
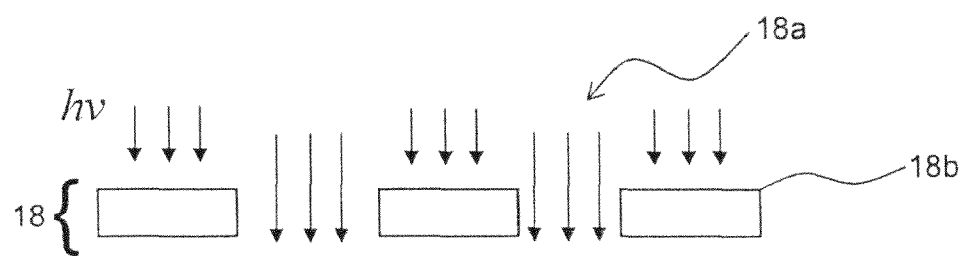
Figure 1:
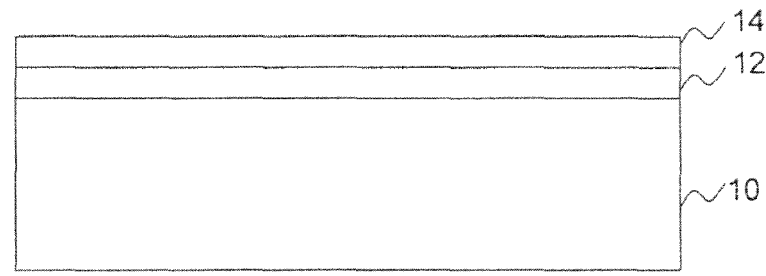

The inventive compositions are thermally curable (i.e., crosslinkable) and capable of being rendered soluble in base developer (i.e., wet-developable) upon exposure to radiation of a selected wavelength. That is, the compositions when cured are preferably insoluble in both organic solvents and photoresist developers, but can be decrosslinked and removed with developer upon exposure to radiation (i.e., the hardmask composition is photosensitive and developer soluble). This results in exposed and unexposed portions of the hardmask layer having different dissolution rates, allowing the exposed portions to be removed without removing the unexposed portions. The terms "developer soluble" or "wet-developable" as used herein mean the composition is capable of being rendered soluble in base developer upon exposure to light so that it can be substantially removed with conventional aqueous developers as described herein.

In more detail, the inventive compositions comprise non-polymeric nanoparticles dissolved or dispersed in a solvent system. The composition preferably comprises from about 0.1% to about 5% by weight nanoparticles, preferably from about 1% to about 3% by weight nanoparticles, and even more preferably from about 1.5% to about 2.5% by weight nanoparticles, based upon the total weight of the composition taken as 100% by weight. The term "nanoparticles" as used herein encompasses particles having a maximum dimension (in any one dimension) on the order of about 1 nm to about 100 nm and behaving as a single unit in terms of its transport and properties, and includes ultra-fine solid particles, colloidal particles, aggregates of two or more covalently bonded atoms (i.e., molecules), particles bearing a charge on the surface (i.e., polyatomic ions), and other finely divided particulate materials. Suitable nanoparticles are commercially available and can be obtained from aqueous or organic colloidal dispersions of nanoparticles (e.g., colloidal silica available from Nissan Chemical, Houston, Tex.), dry powders (e.g., POSS® NANOSTRUCTURED® chemicals available from Hybrid Plastics™, Hattiesburg, Miss.), and/or Meliorum, Rochester, N.Y. The dry powders are typically available in micron-sized agglomerates that can then be dispersed to obtain the nanoscopic dimensions. Alternatively, a nanopowder can be used. The term "non-polymeric" as used herein refers to discrete nanoparticles that do not form more than about 10 polymeric repeats, but remain separate and distinct units in the composition. The preferred nanoparticles for use in the inventive composition preferably have an average particle size of less than about 15 nm, more preferably from about 1 nm to about 10 nm, and even more preferably from about 1 nm to about 5 nm. The "average particle size," as used herein, is defined as the maximum surface-to-surface dimension of the nanoparticle (i.e., this would be the diameter in the case of spherical particles).

The nanoparticles are preferably metal-containing and can comprise any type of metal (including elemental metal) or metal alloy. Preferred metals are selected from the group consisting of silicon (Si), titanium (Ti), hafnium (Hf), zinc (Zn), zirconium (Zr), tin (Sn), aluminum (Al), cerium (Ce), tantalum (Ta), vanadium (V), germanium (Ge), cadmium (Cd), selenium (Se), oxides, hydroxides, selenides, and sulfides of the foregoing, and combinations thereof. The compositions preferably comprise from about 4% to about 80% by weight metal, more preferably from about 20% to about 80% by weight metal, and even more preferably from about 60% to about 80% by weight metal, based upon the total solids in the composition taken as 100% by weight.

The nanoparticles also preferably comprise an acid functional group. More preferably, the respective surfaces of the nanoparticles are functionalized with one or more acid groups (i.e., acid-functionalized nanoparticles). Preferred acid groups are selected from the group consisting of hydroxyl groups (—OH), carboxyl groups (—COOH), phenolics, fluoroalcohols, fluoroacrylamides, and combinations thereof.

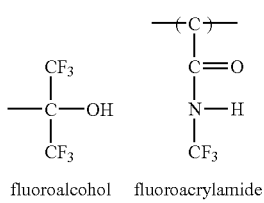

fluoroalcohol    fluoroacrylamide

Suitable nanoparticles are commercially-available with acid functionality. Alternatively, the nanoparticles can be functionalized using known methods such as ligand exchange. Preferably, the nanoparticles comprise at least about 3 acid groups per particle, more preferably about 5 or more acid groups per particle, and even more preferably about 10 or more acid groups per particle.

Particularly preferred compositions comprise a nanoparticle selected from the group consisting of colloidal silica ($SiO_2$) nanoparticles, polyhedral oligomeric silsesquioxane (POSS) molecules, and mixtures thereof dissolved or dispersed in a solvent system. More preferably, these nanoparticles are functionalized with a plurality of acid groups selected from the group consisting of hydroxyl groups, carboxyl groups, and combinations thereof. Preferred POSS molecules are selected from the group consisting of carboxylic acids (e.g., POSS® Octa Amic Acid), molecular silicas (e.g., octakis(tetramethylammonium) pentacyclo[$9.5.1^{3,9}.1^{5,15}.1^{7,13}$]octasiloxane 1,3,5,7,9,11,13,15-octakis(cyloxide) hydrate) such as OctaTMA POSS®), and silanols (e.g., TriSilanolCyclopentyl POSS®, 1,3,5,7,9,11,14-Heptaethyltricyclo[7.3.3.1(5,11)]heptasiloxane-endo-3,7,14-triol such as TriSilanolEthyl POSS®, 1,3,5,7,9,11,14-Heptaisobutyltricyclo [7.3.3.1(5,11)]heptasiloxane-endo-3,7,14-triol such as TriSilanolIsobutyl POSS®, 1,3,5,7,9,11,14-Heptaisooctyltricyclo[7.3.3.1(5,11)]heptasiloxane-endo-3,7,14-triol such as TriSilanolIsooctyl POSS®, 1,3,5,7,9,11,14-Heptaphenyltricyclo[7.3.3.1(5,11)]heptasiloxane-endo-3,7,14-triol such as TriSilanolPhenyl POSS®, and Tricyclo[7.3.3.3(3,7)]octasiloxane-5,11,14,17-tetraol-1,3,5,7,9,11,14,17-octaphenyl such as TetraSilanolPhenyl POSS®), all available from Hybrid Plastics™.

The compositions will also preferably include a crosslinker (used interchangeably herein with the term "crosslinking agent") dissolved or dispersed in the solvent system with the nanoparticle. Preferred crosslinkers are vinyl ether crosslinkers. It is particularly preferred that the crosslinkers be multifunctional (di-, tri-, and tetra-functional). An example of commercially-available vinyl ethers include those sold under the trade name VECTomer™ (Aldrich; St. Louis, Mo.). Suitable vinyl ether crosslinkers can also be prepared as described herein. The crosslinker is preferably present in the composition at a level of from about 0.1% to about 5% by weight, preferably from about 0.5% to about 2.5% by weight, and even more preferably from about 1% to about 2% by weight, based upon the total weight of the composition taken as 100% by weight.

More preferably, the vinyl ether crosslinkers, when present, have the formula $$R'-(X-O-CH=CH_2)_n,$$

where R' is selected from the group consisting of aryls (preferably $C_6$-$C_{14}$) and alkyls (preferably $C_1$-$C_{18}$, and more preferably $C_1$-$C_{10}$), each X is individually selected from the group consisting of alkyls (preferably $C_1$-$C_{18}$, and more preferably $C_1$-$C_{10}$), alkoxys (preferably $C_1$-$C_{18}$, and more preferably $C_1$-$C_{10}$), carbonyls, and combinations of two or more of the foregoing, and n is at least 2, and preferably from 2-6. The most preferred vinyl ethers include those selected from the group consisting of ethylene glycol vinyl ether, trimethylolpropane trivinyl ether, 1,4-cyclohexane dimethanol divinyl ether, and mixtures thereof. Another preferred vinyl ether has a formula selected from the group consisting of

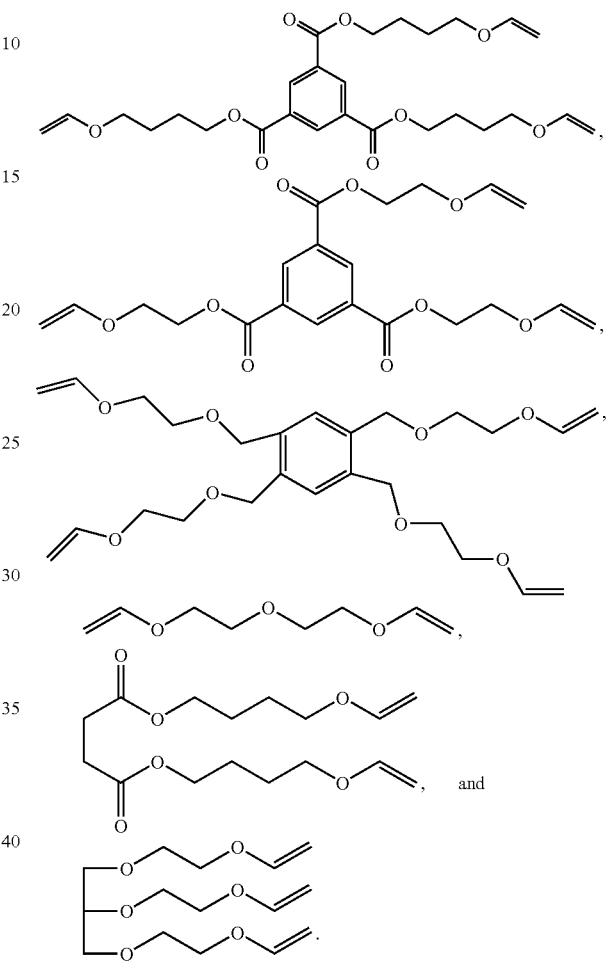

Preferred solvent systems include a solvent selected from the group consisting of ethyl lactate (EL), propylene glycol methyl ether acetate (PGMEA), propylene glycol methyl ether (PGME), propylene glycol n-propyl ether (PnP), dimethyl-acetamide, cyclohexanone, and mixtures thereof. Preferably, the solvent system has a boiling point of from about 50-250° C., and more preferably from about 100-175° C. The solvent system should be utilized at a level of from about 90% to about 99.9% by weight, preferably from about 95% to about 99% by weight, and even more preferably from about 97.5% to about 98.5% by weight, based upon the total weight of the composition taken as 100% by weight. The composition will preferably comprise a solids content of from about 0.1% to about 90% by weight, preferably from about 1% to about 5% by weight, and even more preferably from about 1.5% to about 2.5% by weight, based upon the total weight of the composition taken as 100% by weight.

Crosslinking of the nanoparticles is preferably initiated thermally, and this is typically accomplished by an acid catalyst dispersed or dissolved in the solvent system with the crosslinker and nanoparticle. Preferred catalysts include sulfonic acids (e.g., p-toluenesulfonic acid, styrene sulfonic acid), sulfonates (e.g., pyridinium p-toluenesulfonate, pyridinium trifluoromethanesulfonate, pyridinium 3-nitrobenzensulfonate), and mixtures thereof. The compositions can comprise from about 0% to about 5% by weight catalyst, preferably from about 0.01% to about 2% by weight catalyst, and more preferably from about 0.02% to about 1% by weight catalyst based upon the total weight of solids in the composition taken as 100% by weight. Preferably, the catalyst is dispersed or dissolved in the solvent system with the nanoparticle and crosslinker at ambient conditions and for time periods of from about 1 to about 18 hours.

In a preferred embodiment, an acid generator can then be added to the composition. Alternatively, the ingredients in the composition can simply be dispersed or dissolved in the solvent system all at once. A preferred acid generator is a photoacid generator ("PAG"; both ionic and/or non-ionic). Any PAG that produces an acid in the presence of radiation is suitable. Preferred PAGs are selected from the group consisting of di-(p-t-butylphenyl) iodonium tris(perfluoromethanesulfonyl)methide (e.g., DTBPI-C1; obtained from DAYCHEM Laboratories, Inc., Vandalia, Ohio), onium salts (e.g., triphenyl sulfonium perfluorosulfonates such as triphenyl sulfonium nonaflate and triphenyl sulfonium triflate, and), oxime-sulfonates (e.g., those sold under the name CGI® by CIBA), triazines (e.g., TAZ108® available from Midori Kagaku Company), and mixtures thereof. The compositions preferably comprise from about 0% to about 10% by weight acid generator, preferably from about 1% to about 8% by weight acid generator, and even more preferably from about 2% to about 5% by weight acid generator, based upon the total weight of the solids taken as 100% by weight.

Although a thermal acid generator ("TAG") can be included in the inventive compositions, in a preferred embodiment the composition is essentially free of TAGs. That is, any TAGs, if present, are included at very low levels of less than about 0.5% by weight, and preferably about 0% by weight, based upon the total weight of the composition taken as 100% by weight.

The preferred compositions will also include a quencher. Preferred quenchers are selected from the group consisting of triethanolamine, triethylamine, trimethanolamine, trimethylamine, triisopropanolamine, triisopropylamine, tri-t-butanolamine, tri-t-butylamine, tri-n-butanolamine, tri-n-butylamine, diethanolamine, diethylamine, dimethanolamine, dimethylamine, diisopropanolamine, diisopropylamine, di-t-butanolamine, di-t-butylamine, di-n-butanolamine, di-n-butylamine, ethanolamine, ethylamine, methanolamine, methylamine, isopropanolamine, isopropylamine, t-butanolamine, t-butylamine, n-butanolamine, and n-butylamine, and combinations thereof. When present, the anti-reflective coating compositions will preferably comprise from about 0% to about 5% by weight quencher, preferably from about 0.25% to about 4% by weight, and even more preferably from about 0.5% to about 2% by weight, based upon the total weight of solids in the composition taken as 100% by weight.

Additional ingredients that may be included in the composition include surfactants, adhesion promoters, antioxidants, photoinitiators, and combinations of the foregoing. Polymers can also be included in the composition. Examples of polymers that can be used in the composition include those selected from the group consisting of acrylates, methacrylates, styrenes, acrylamides, methacrylamides, and combinations thereof. Suitable polymers preferably have a molecular weight of from about 1,000 to about 50,000 Daltons, more preferably from about 3,000 to about 25,000 Daltons, and even more preferably from about 4,000 to about 15,000 Daltons. However, it is preferred that the composition be substantially free of polymeric ingredients (i.e., those with more than 100 repeat units). Thus, the inventive compositions preferably comprise less than about 5% by weight polymers, and more preferably less than about 2% by weight polymers, based upon the total weight of solids in the composition taken as 100% by weight.

The Inventive Methods and Structures

FIGS. 1(A)-1(D) illustrate a preferred embodiment of the invention. In the method, a substrate 10 having a surface 10a is provided. Any microelectronic substrate can be used in the invention. Exemplary substrates 10 include those selected from the group consisting of silicon, SiGe, $SiO_2$, $Si_3N_4$, aluminum, tungsten, tungsten silicide, gallium arsenide, germanium, tantalum, tantalum nitride, coral, black diamond, phosphorous or boron doped glass, and mixtures of the foregoing. The methods comprise applying the inventive composition to the substrate 10 to form a layer 12 of the composition on the surface 10a of substrate 10. The composition can be applied by any known application method, with one preferred method being spin-coating the composition at speeds of from about 500 to about 5,000 rpm (preferably from about from about 1,000 to about 3,000 rpm) for a time period of from about 15 to about 90 seconds (preferably from about 30 to about 60 seconds). The composition may be applied directly to the substrate surface 10a, or to one or more optional intermediate layers (not shown) that have been formed on the substrate surface. Suitable intermediate layers include those selected from the group consisting of spin-on carbon layers (SOC), amorphous carbon layers, bottom anti-reflective coatings, planarization layers, and combinations of the foregoing. Regardless, the substrate 10 can comprise a planar surface, or it can include topography (via holes, contact holes, raised features, etc.). As used herein, "topography" refers to the height or depth of a structure in or on a substrate surface.

After the hardmask composition is applied, it is preferably subjected to a curing step by heating at a temperature of from about 110-250° C., and more preferably from about 130-205° C. to form a crosslinked matrix of the nanoparticles in the composition (i.e., a cured hardmask layer 12), for time periods of from about 10 seconds to about 120 seconds (preferably from about 30 seconds to about 90 seconds). For example, in embodiments where the acid functional group on the nanoparticle is a carboxyl group, and the crosslinker is a vinyl ether crosslinker, the crosslinked nanoparticle matrix will comprise acetal linkages. The thickness of the hardmask layer 12 after baking is preferably from about 1 nm to about 100 nm, more preferably from about 10 nm to about 80 nm, and even more preferably from about 20 nm to about 40 nm.

The hardmask layer 12 preferably possesses light absorbing properties. Specifically, the hardmask layer 12 used in the inventive methods will preferably have a k value (the imaginary component of the complex index of refraction) of at least about 0.05, preferably from about 0.1 to about 0.3, and more preferably from about 0.15 to about 0.25, and an n value (the real component of the complex index of refraction) of at least about 1.45, and preferably from about 1.55 to about 2.25, and more preferably from about 1.65 to about 2. These values can be obtained at a wide range of wavelengths, including wavelengths of less than about 500 nm (e.g., 365 nm, 248 nm, 193 nm, 157 nm, or 13.5 nm).

Advantageously, the cured hardmask layer 12 will be sufficiently crosslinked that it will be substantially insoluble in typical solvents such as EL, PGMEA, PGME, PnP, cyclohexanone, acetone, Gamma butyrolactone (GBL), and mixtures thereof. Thus, when subjected to a stripping test, the cured hardmask layer 12 will have a percent stripping of less than about 5%, preferably less than about 1%, and even more preferably about 0%. The stripping test involves first determining the thickness by taking the average of measurements at five different locations of the cured layer. This is the initial average film thickness. Next, the film is rinsed with a solvent (e.g., ethyl lactate) for about 30 seconds, followed by spin drying at about 500-3,000 rpm for about 20-60 seconds to remove the solvent. The thickness is measured again at five different points on the wafer using ellipsometry, and the average of these measurements is determined. This is the average final film thickness.

The amount of stripping is the difference between the initial and final average film thicknesses. The percent stripping is:

$$\% \text{ stripping} = \left(\frac{\text{amount of stripping}}{\text{initial average film thickness}}\right) \times 100.$$

The cured hardmask layer 12 is also preferably substantially insoluble in typical photoresist developers as described herein. The solubility of the cured hardmask layer in developer is evaluated using the same procedure and calculation as that for the stripping test described above. However, instead of rinsing with a solvent such as EL, the cured layer is immersed for 60 seconds in 0.26 N tetramethyl ammonium hydroxide (TMAH) developer. Any loss of thickness in the cured layer is defined as the "dark loss." The cured layer will preferably have a dark loss of less than about 10%, preferably less than about 5%, and even more preferably about 0%.

The hardmask layer 12 should also have a high etch selectivity over the substrate 10 to provide an adequate plasma barrier. This is because the subsequently-applied photoresist in this process is used for patterning the hardmask layer 12 by exposure and wet development only, whereas the photoresist functions as a plasma-etch barrier as well in conventional processes. Thus, the etch selectivity of the hardmask layer 12 over the substrate 10 will be at least about 10:1, preferably at least about 20:1, and more preferably from about 25:1 to about 100:1, when $O_2$ plasma is used as the etchant. Furthermore, the etch selectivity of the hardmask layer 12 over the photoresist (e.g., a 193-nm photoresist) will be at least about 1, preferably at least about 1.5, and more preferably from about 2 to about 4, when $CF_4$ plasma is used as the etchant. The hardmask layer 12 should etch at a rate of less than about 30 nm/min., and more preferably from about 0 nm/min to about 10 nm/min., when $O_2$ plasma is the etchant.

A photoresist composition can then be applied to the cured hardmask layer to form an imaging layer 14. The resulting stack 16 is illustrated in FIG. 1(B). The imaging layer 14 is then post-application baked ("PAB") at a temperature of at least about 85° C., and preferably from about 90° C. to about 120° C., for time periods of from about 30 seconds to about 90 seconds. Suitable imaging compositions include commercially-available photoresists (e.g., Pi6-001, TOK, Kawasaki shi, Kanagawa (Japan); ARX3001, JSR Micro, Sunnyvale, Calif.; AM2073J, JSR Micro), or any other photosensitive compositions.

The imaging layer 14 can then be patterned by exposure to light of the appropriate wavelength followed by development of the exposed photoresist. More specifically, the imaging layer 14 is exposed using a mask 18 positioned above the surface of the imaging layer 14. The mask 18 has open areas 18a designed to permit radiation (hv) to pass through the mask 18 and contact the imaging layer 14. The remaining solid portions 18b of the mask 18 are designed to prevent radiation from contacting the surface of imaging layer 14 in certain areas. Those skilled in the art will readily understand that the arrangement of open areas 18a and solid portions 18b is designed based upon the desired pattern to be formed in the imaging layer 14 and ultimately in the substrate 10.

Advantageously, as the imaging layer 14 is exposed to radiation (i.e., light), so is the inventive hardmask layer 12. Upon exposure to light, the nanoparticle matrix in the photosensitive hardmask layer 12 is "decrosslinked." That is, the bond that was formed between the nanoparticles and the crosslinker upon thermal crosslinking is broken. Thus, upon exposure, the portions of the hardmask layer 12 and imaging layer 14 that are exposed to radiation are simultaneously rendered soluble in aqueous developer. After exposure, the imaging layer 14 and hardmask layer 12 are preferably subjected to a post-exposure bake (PEB) at a temperature of from about 85° C. to about 130° C., more preferably from about 90° C. to about 110° C., for a time period of from about 30 seconds to about 90 seconds.

The exposed portions of the imaging layer 14 and hardmask layer 12 which were made soluble by the above process, are then contacted with a photoresist developer to remove the exposed portions. The exposed portions of the hardmask layer 12 underneath the exposed portions of the imaging layer 14 are removed by the developer as the imaging layer 14 is removed so as to simultaneously form the desired pattern 20 in the imaging layer 14 and the hardmask layer 12. The pattern 20 can be via holes, trenches, lines, spaces, etc., that will ultimately be transferred to the substrate 10 using an etch or ion implantation process. Preferably, at least about 95% of the exposed portions of the imaging layer 14 and hardmask layer 12 will be removed by the developer, more preferably at least about 99%, and even more preferably about 100% will be removed. Advantageously, if a developer soluble intermediate layer is utilized (e.g., a developer soluble bottom anti-reflective coating), then the exposed portions of the intermediate layer can also be cleared to simultaneously form the desired pattern 20 in the imaging layer 14, hardmask layer 12, and intermediate layer (not shown).

Suitable developers are organic or inorganic alkaline solutions such as potassium hydroxide (KOH), TMAH, and preferably comprise an aqueous solution of TMAH at a concentration of 0.26N or lower. Some of these developers are commercialized under the tradenames PD523AD (available from Moses Lake Industries, Inc., Moses Lake, Wash.), MF-319 (available from Shipley, Mass.), MF-320 (available from Shipley), and NMD3 (available from TOK, Japan). Preferably, the dissolution rate of the hardmask layer 12 in 0.26N TMAH developer after exposure will be from about 50 nm/second to about 250 nm/second, and even more preferably from about 100 nm/second to about 200 nm/second.

Conventional etching, metallization, etc., can then be carried out on the patterned stack 22 to complete the device manufacture. The exposure-development process can also be repeated using a second imaging layer applied adjacent to the patterned hardmask layer if a multiple exposure process is desired.

In an alternative embodiment, ArF immersion lithography (not shown) can be used to pattern the photoresist. Instead of air (as in conventional lithography), the medium through which the radiation passes during exposure is a liquid. The imaging layer 14 is exposed to radiation via an optical projection element (i.e., lens) of a lithographic system, with the immersion liquid contacting at least a portion of the optical element of the lithographic system and a portion of the structure (i.e., the stack 16). Even more preferably, the liquid fills the space between the last optical element in the system and the imaging layer 14, such that the optical element is immersed in the liquid. Suitable immersion liquids preferably have a refractive index greater than 1 (preferably from about 1 to about 2, and more preferably from about 1.3 to about 1.4), and are selected from the group consisting of water (preferably purified water), organic solvents, and mixtures thereof. Immersion lithography systems are known in the art and include the Amphibian Interferometer from Amphibian™ Systems (Rochester, N.Y.).

EXAMPLES

The following examples set forth preferred methods in accordance with the invention. It is to be understood, however, that these examples are provided by way of illustration and nothing therein should be taken as a limitation upon the overall scope of the invention.

Example 1

Hardmask Formulation I

In this procedure, a photosensitive hardmask was formulated by first diluting 3.5 grams of isopropanol solution of colloidal silica (~30 wt % SiO$_2$, average particle size 10-15 nm) (Organosilicasol™ IPA-ST; obtained from Nissan Chemical, Houston, Tex.) with 5 ml of PGME (obtained from Harcros Chemicals, St. Louis, Mo.). Then, 350 mg of trifunctional vinyl ether crosslinker (see Example 8) were added into the solution, together with 5 mg of pyridinium p-toluenesulfonate (PPTS; obtained from Aldrich, Milwaukee, Wis.). The mixture was stirred overnight at room temperature in a glass vial and then diluted further with PGME to a total solution weight of 56 grams. Next, 20 mg of triethanolamine (TEA; obtained from Aldrich, Milwaukee, Wis.) and 26 mg of the PAG di-(p-t-butylphenyl) iodonium tris(perfluoromethanesulfonyl)methide (DTBPI-C1; obtained from DAYCHEM Laboratories, Inc., Vandalia, Ohio) were added. This final formulation was filtered through a particle filter.

Formulation 1 was spin-coated at 2,000 rpm onto a silicon substrate and then baked at 130° C. for 60 seconds. The optical constants were measured using a variable-angle spectroscopic ellipsometer (VASE®; J.A. Woollam Co., Inc.). The n value of the film at 193 nm=1.40. The k value of the film at 193 nm=0.075. The n value of the film at 248 nm=1.45. The k value of the film at 248 nm=0.021.

The film's solvent resistance was then tested. A substrate was coated with Formulation 1 as described above and the initial thickness of the film was measured. The film was then rinsed with EL for 30 seconds (Harcros Chemicals, St Louis, Mo.). The resulting thickness of the film was again measured and recorded. To evaluate dark loss, another substrate was coated with Formulation 1, and the initial thickness of the film was measured and recorded. The film was then immersed for 60 seconds in a 0.26 N TMAH photoresist developer (PD523AD; obtained from Moses Lake Industries, Inc., Moses Lake, Wash.). The film's thickness was measured and recorded. To evaluate the wet development of the film, a third substrate was coated with Formulation 1 as described above, and the film's initial thickness was measured. The film was then exposed to light at 248 nm from a mercury-xenon lamp, followed by post-exposure baking (PEB) at 130° C. for 60 seconds and development using PD523AD for 60 seconds. The resulting thickness was measured. The results, summarized in Table 1 below, indicate that Formulation 1 has good solvent resistance and little dark loss, but can be removed by alkaline developer after exposure.

TABLE 1

|  | 30-sec EL strip | Development without Exposure | Exposure, PEB, and Development |
|---|---|---|---|
| Initial Thickness (Å) | 691 | 725 | 683 |
| Resulting Thickness (Å) | 732 | 776 | 0 |
| % change | 5.9% | 7.0% | −100% |

Example 2

Hardmask Formulation 2 and Photosensitivity Test

Figure 2:
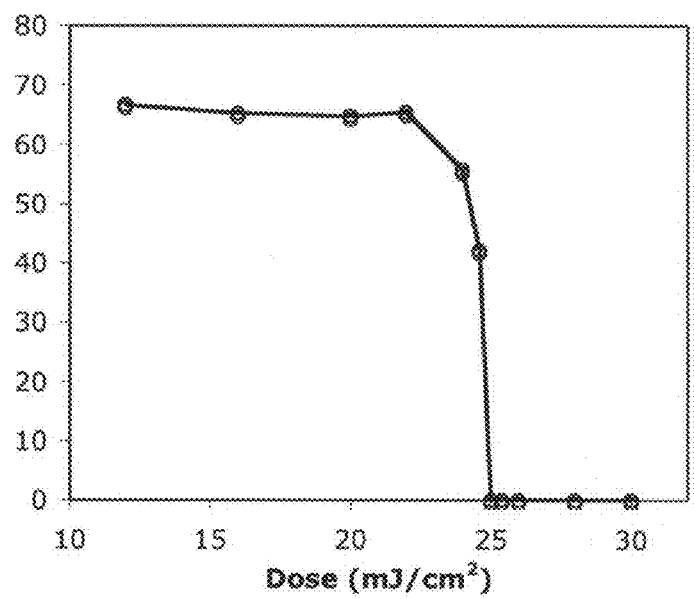
FIG. 2 is a contrast curve of the thickness of a layer of hardmask Formulation 2 (in nm) versus the exposure dose (in $mJ/cm^2$) from Example 1.

In this procedure, a second hardmask formulation was prepared by adding 10 mg of DTBPI-C1 PAG to 10 mg of hardmask Formulation 1 from Example 1 above to produce a more photosensitive Formulation 2. The formulation was spin-coated at 2,000 rpm onto a silicon substrate and then baked at 130° C. for 60 seconds. The film was then exposed to UV light through a 248-nm filter for various periods of time (i.e., 5, 8, 10, and 12 seconds). After PEB at 130° C. for 60 seconds and development using PD523AD, the remaining thickness (in nanometers) of the exposed areas was measured and plotted against the exposure dose (in mJ/cm$^2$). The representative contrast curve shown in FIG. 2 clearly indicates the sharp contrast of developer solubility before and after the exposure dose reached 25 mJ/cm$^2$.

Example 3

Imaging Using Formulation 2 on Anti-reflective Coating Material

Figure 3:
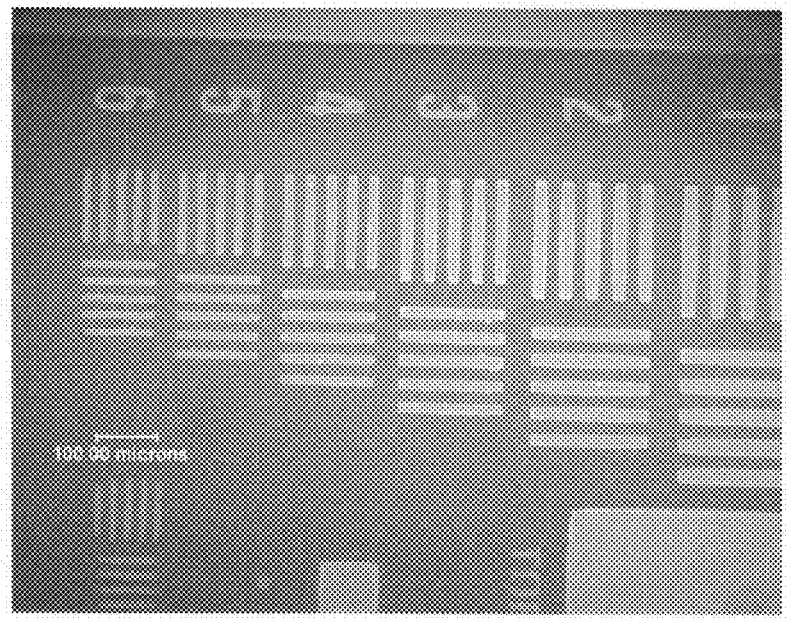
FIG. 3 is a scanning electron microscope (SEM) photograph of the patterns formed in Example 3 using hardmask Formulation 2.

In this procedure, a structure was prepared and patterned using hardmask Formulation 2 from Example 2 above. First, an anti-reflective coating material (ARC® 29A; obtained from Brewer Science, Inc., Rolla, Mo.) was spin-coated onto a silicon wafer at 2,500 rpm, followed by baking at 205° C. The anti-reflective coating had a thickness of 80 nm. Formulation 2 was spin-coated at 2,000 rpm on top of the ARC® 29A coating and then baked at 130° C. for 60 seconds. The film stack was exposed to UV light through a 248-nm filter to give an exposure of >25 mJ/cm$^2$ (according to the contrast curve in FIG. 2). After PEB at 130° C. for 60 seconds and development using PD523AD, the resulting patterns were imaged under optical microscopy to give FIG. 3, which shows positive micropatterns (down to 10-μm lines) that were resolved using hardmask Formulation 2.

Example 4

Formulation 3 and Test with Commercial Photoresist

Figure 4:
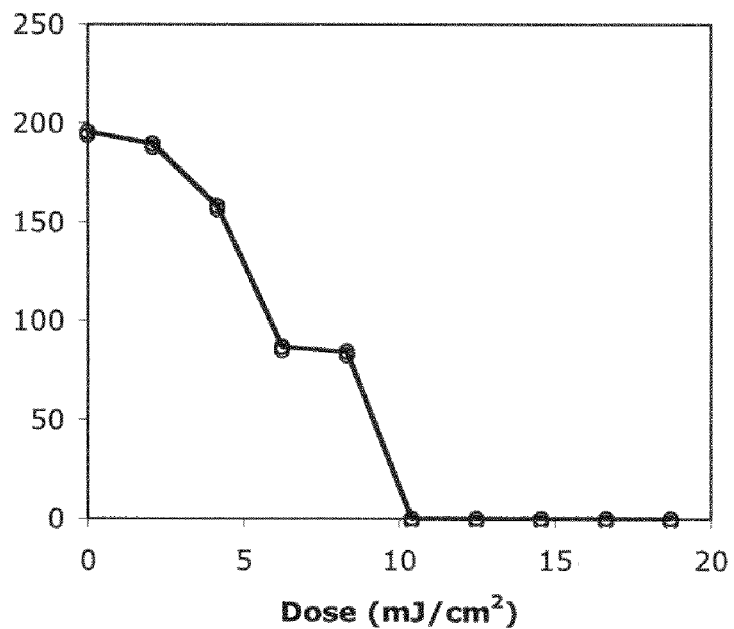
FIG. 4 is a contrast curve of the thickness of a layer of hardmask Formulation 3 with an ArF photoresist layer on top (in nm) versus the exposure dose (in $mJ/cm^2$) from Example 4.

In this procedure, a third hardmask formulation was prepared and tested using a commercially-available photoresist. A more photosensitive hardmask Formulation 3 was prepared by adding 15 mg of DTBPI-C1 PAG to 10 grams of Formulation 1. The resulting formulation was spin-coated at 2,500 rpm onto a silicon substrate and then baked at 130° C. for 60 seconds. An ArF photoresist (AM2073J; obtained from JSR Micro, Sunnyvale, Calif.) was spin-coated on top of the hardmask layer at 1,750 rpm, followed by baking at 112° C. for 60 seconds. The film stack was then exposed to UV light through a 248-nm filter for various periods of time (i.e., 0, 2, 4, and 6 seconds). After PEB at 130° C. for 60 seconds and development using PD523AD, the remaining thickness (in nanometers) was measured and plotted against the exposure dose (in mJ/cm$^2$). The representative contrast curve shown in FIG. 4 clearly indicates that Formulation 3 and the photoresist cleared out together when the exposure dose reached ~10 mJ/cm$^2$.

Example 5

Formulation 4 and Test with a Developer Soluble Anti-Reflective Underlayer and ArF Photoresist on Top In this procedure, a fourth hardmask formulation was prepared by diluting 3.5 grams of IPA-ST with 10 ml of PnP (obtained from Harcros, St. Louis, Mo.). Then, 350 mg of an in-house vinyl ether crosslinker (obtained from Brewer Science, Inc., Rolla, Mo.) were added to the solution. The preparation of this crosslinker is described in Example 9 below. The mixture was further diluted with PnP to a 56-gram total solution weight, and then 7 mg of TEA were added. The final Formulation 4 was filtered through a particle filter.

A bottom anti-reflective coating (BSI.W07046B; obtained from Brewer Science, Inc., Rolla, Mo.) was first spin-coated onto a silicon wafer at 1,500 rpm, followed by baking at 160° C. for 60 seconds. Formulation 4 was then spin-coated at 2,000 rpm on top of the bottom anti-reflective coating and then baked at 150° C. for 60 seconds. ArF photoresist AM2073J was spin-coated on top of the hardmask layer at 1,300 rpm, followed by baking at 110° C. for 60 seconds.

Figure 5:
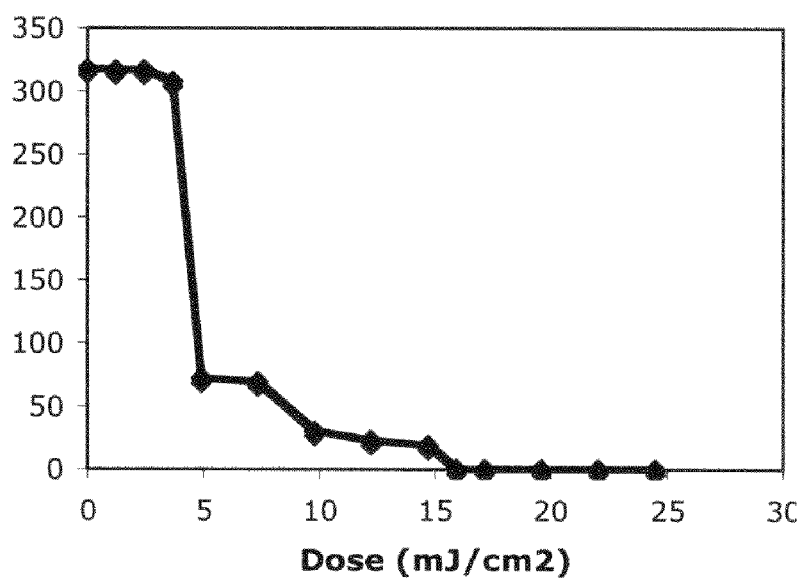
FIG. 5 is a contrast curve of the thickness (in nm) of the trilayer stack (bottom anti-reflective coating, hardmask Formulation 4, and photoresist) from Example 5 versus the exposure dose (in $mJ/cm^2$)

The resulting film stack was exposed to UV light through a 248-nm filter for various periods of time (i.e., 0, 2, 4, and 6 seconds). After PEB at 130° C. for 90 seconds and development using PD523AD, the remaining thickness (in nanometers) of the exposed areas was measured and plotted against the exposure dose (in mJ/cm$^2$). As shown in FIG. 5, even though no PAG molecules were added to Formulation 4, it was still developer soluble with the top photoresist layer and bottom developable bottom anti-reflective layer due to photoacid diffusion.

Example 6

Preparation of Formulation 5 and Corresponding Tests

Hardmask Formulation 5 was prepared by diluting 5 grams of IPA-ST with 94.423 grams of PGME. Next, 500 mg of the in-house vinyl ether crosslinker prepared in Example 9 below were added to the diluted IPA-ST solution, along with 11.5 mg of TEA, 27.9 mg of triphenylsulfonium perfluoro-1-butanesulfonate (TPS-nonaflate PAG; obtained from Sigma-Aldrich, Inc., St. Louis, Mo.), and 37.6 mg of tris(4-tert-butylphenyl)sulfonium perfluoro-1-butanesulfonate (SAFC PAG; obtained from Sigma-Aldrich, Inc., St. Louis, Mo.). The final Formulation 5 was filtered through a particle filter.

Formulation 5 was spin-coated at 1,500 rpm onto a silicon substrate and then baked at 160° C. for 60 seconds. Using the VASE®, the optical constants were measured. The n value of the film at 193 nm=1.45. The k value of the film at 193 nm=0.083. The n value of the film at 248 nm=1.46. The k value of the film at 248 nm=0.029.

The solvent resistance of the film was then testing using the EL stripping, dark loss, and wet development testing using the procedures described in Example 1. The results are summarized in Table 2 below.

TABLE 2

|  | 30-sec EL strip | Development without Exposure | Exposure, PEB, and Development |
|---|---|---|---|
| Initial Thickness (Å) | 643 | 643 | 651 |
| Resulting Thickness (Å) | 654 | 645 | 0 |
| % change | 1.7% | 0.3% | −100% |

The blanket etch rates for Formulation 5 were then determined using a mixture of CF$_4$, argon, and oxygen gases to assess the ability of the patterned films to serve as pattern-transfer layers. Table 3 shows the conditions used and etch rate according to a 45-second etch.

TABLE 3

| Run | CF$_4$ (SCCM) | Ar (SCCM) | O$_2$ (SCCM) | Rate (nm/min) |
|---|---|---|---|---|
| 1 | 50 | 0 | 0 | 39 |
| 2 | 16.5 | 16.5 | 16.5 | 51 |
| 3 | 0 | 25 | 25 | 3 |
| 4 | 16.5 | 16.5 | 16.5 | 51 |
| 5 | 0 | 0 | 50 | 2 |
| 6 | 0 | 50 | 0 | 6 |
| 7 | 33.5 | 8.5 | 8.5 | 64 |
| 8 | 8.5 | 33.5 | 8.5 | 69 |
| 9 | 25 | 0 | 25 | 61 |
| 10 | 16.5 | 16.5 | 16.5 | 51 |
| 11 | 25 | 25 | 0 | 37 |
| 12 | 8.5 | 8.5 | 33.5 | 24 |

Figure 6:
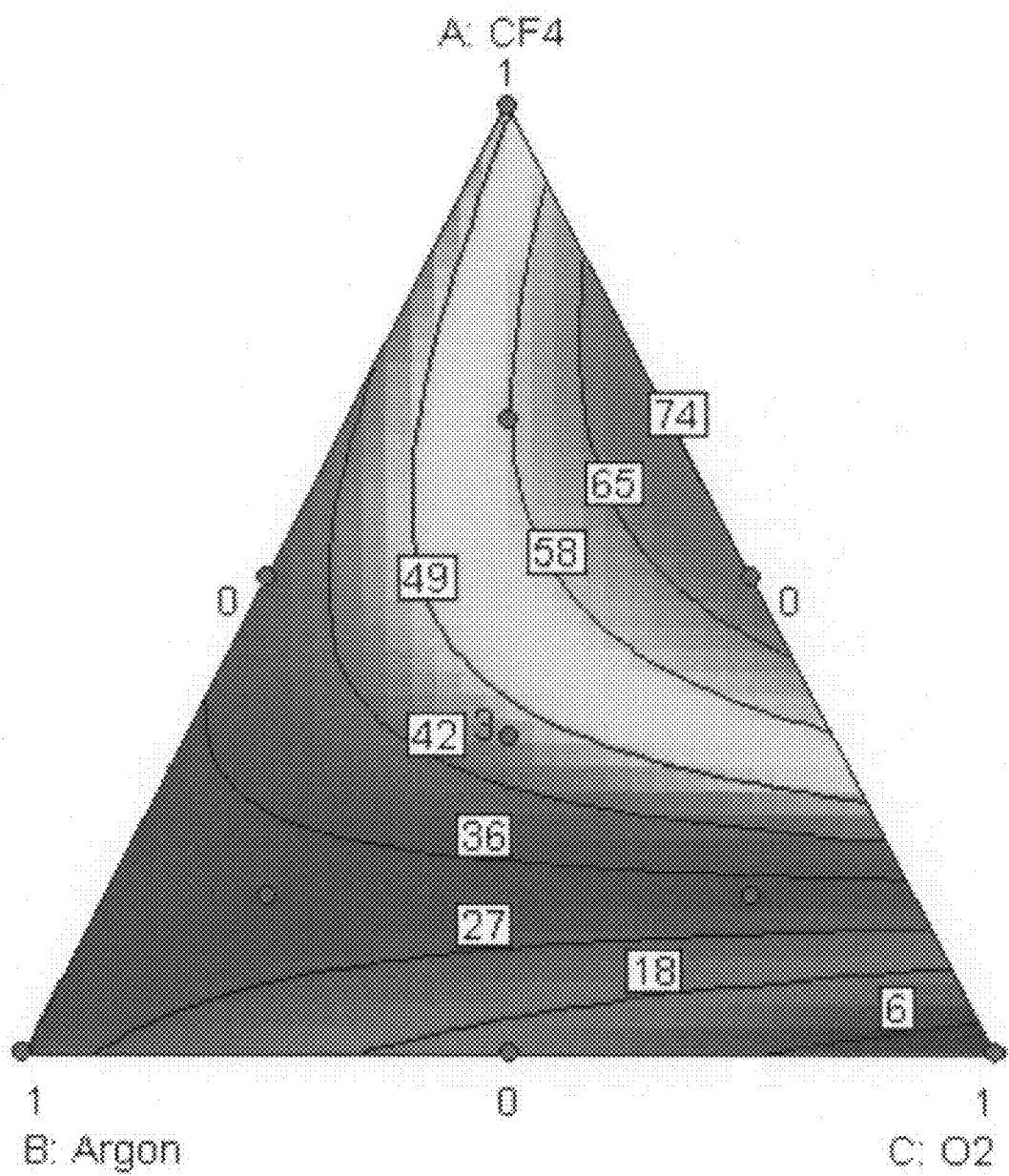
FIG. 6 illustrates the etch rate of Formulation 5 (in nm/min) using $CF_4$, Ar, and $O_2$ gas mixtures from Example 6.

The relationships between etch rate and gas mixture were analyzed and are shown in FIG. 6. The etch rates at any given condition are generally slower than organic resists or bottom anti-reflective coating materials at the same conditions. This hardmask formulation shows excellent etch resistance in pure oxygen plasma etch, while the mixture of CF$_4$ and oxygen (approximately 1:2 ratio) provides a reasonably fast etch.

Example 7

Preparation of Hardmask Formulation 6

In this procedure, another hardmask formulation was prepared by dissolving 240 mg of POSS® Octa Amic Acid (average particle size 1.5 nm) (POSS® Nanostructured® Chemical, obtained from Hybrid Plastics™, Hattiesburg, Miss.), 80 mg of an in-house vinyl ether crosslinker (obtained from Brewer Science, Inc., Rolla, Mo.; see Example 9), 9.6 mg triphenyl sulfonium triflate PAG (Aldrich, St. Louis, Mo.) in 9.674 grams of dimethyl-acetamide (Aldrich, St. Louis, Mo.) to make a total 10 gram solution. The solution was mixed overnight at room temperature in a 20-mL glass vial and then was filtered through a particle filter.

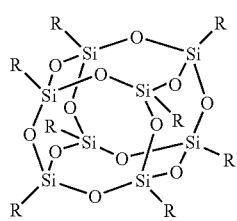

Chemical structure of POSS® Octa Amic Acid

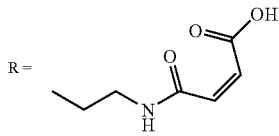

Formulation 6 was spin-coated at 1,500 rpm onto a silicon substrate and then baked at various temperatures (e.g., 130° C., 155° C., 170° C.) for 60 seconds. The resulting film was immersed in photoresist developer without light exposure to evaluate the dark loss. After 130° C. bake, the film was totally stripped away (100% dark loss). After baking at 155° C., thickness changed from 87.9 nm to 39.9 nm (54.6% dark loss), and after 170° C. bake, thickness changed from 72.5 nm to 70.8 nm (2.3% dark loss).

Example 8

Trifunctional Vinyl Ether Crosslinker Formulation

In this Example, a trifunctional vinyl ether crosslinker was prepared according to the reaction scheme below.

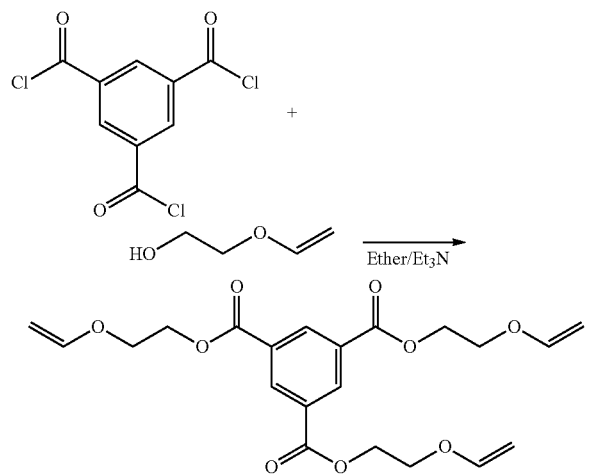

First, 6 grams of ethylene glycol vinyl ether and 7.5 ml of triethyl amine were mixed in 40 ml of ether and treated dropwise with a solution of trimesic acid chloride (6 grams) in ether (40%). After the addition, the mixture was heated to reflux for 1.5 hours. Residual salts were removed by filtration, and the ether solution was washed with 10% NaOH (2×25 ml), followed by washing with water (25 ml), and then dried over anhydrous magnesium sulfate. After removal of the solvent under pressure, light yellow oil was collected. Total yield was 69%.

Example 9

Additional Vinyl Ether Crosslinker Formulation

In this Example, another trifunctional vinyl ether crosslinker was prepared by adding 25.15 grams of tetramethylene glycol monovinyl ether (Aldrich, St Louis, Mo.), 22.91 grams of triethylamine (Aldrich, St Louis, Mo.), and 250 ml tetrahydrofuran ("THF"; Aldrich, St. Louis, Mo.) to a 500-ml, 2-neck flask. The flask was equipped with a stir bar, addition funnel, condenser, and nitrogen inlet and outlet. The flask was immersed in an ice water bath and the solution was stirred under a flow of nitrogen.

Next, 20.00 grams of 1,3,5-benzenetricarbonyl trichloride (Aldrich, St. Louis, Mo.) were dissolved in 50 ml THF in a 250-ml Erlenmeyer flask. This solution was transferred to the addition funnel on the 500-ml 2-neck flask and added dropwise to the stirring tetramethylene glycol monovinyl ether/triethylamine/THF solution for about 15 minutes, until the addition was completed. A white precipitate formed on contact. The flask was then removed from the ice bath and the slurry was allowed to come to room temperature in the flask, which took approximately 16 hours. The slurry was then heated to reflux for 4 hours. The flask was removed from the heat and allowed to cool to room temperature. The slurry was then filtered using a suction filtration setup, and concentrated using a rotary evaporator to give a viscous yellow liquid.

This liquid was dissolved in 100 ml of diethylether (Aldrich, St. Louis, Mo.) and washed twice with 25-ml portions of aqueous, 12.5% TMAH (Aldrich, St. Louis, Mo.). The ether layer was extracted using a separatory funnel and then washed twice using 50-ml portions of deionized water. The ether layer was allowed to settle out and collected. The ether layer was dried by mixing with 5.0 g of activated basic alumina. The mixture was stirred for 1 hour and gravity filtered. The clear yellow liquid was concentrated in a rotavap to give a yellow viscous oil. Total yield was approximately 29.28 grams (77% yield).

We claim:
1. A method of forming a microelectronic structure, said method comprising:
   (a) providing a substrate having a surface;
   (b) optionally forming one or more intermediate layers on said surface;
   (c) applying a hardmask composition adjacent said intermediate layers, if present, or adjacent said substrate surface if no intermediate layers are present, said hardmask composition comprising a non-polymeric nanoparticle dissolved or dispersed in a solvent system;
   (d) baking said hardmask composition to yield a hardmask layer;
   (e) exposing said hardmask layer to radiation to yield an exposed portion of said hardmask; and
   (f) contacting said hardmask layer with a developer so as to remove said exposed portion of said hardmask layer.

2. The method of claim 1, further comprising applying an imaging layer to said hardmask layer prior to said exposing.

3. The method of claim 2, wherein said exposing yields exposed portions of said imaging layer and said contacting removes said exposed portions of said hardmask layer and said exposed portions of said imaging layer simultaneously.

4. The method of claim 1, wherein said baking comprises crosslinking the nanoparticles in said composition, yielding a crosslinked matrix of said nanoparticles to form said hardmask layer.

5. The method of claim 4, wherein said exposing comprises decrosslinking said matrix.

6. The method of claim 1, wherein said intermediate layer is selected from the group consisting of spin-on carbon layers, amorphous carbon layers, bottom anti-reflective coatings, planarization layers, and combinations of the foregoing.

7. The method of claim 6, wherein said exposing yields exposed portions of said intermediate layer and said contacting removes said exposed portions of said hardmask layer and said exposed portions of said intermediate layer simultaneously.

8. The method of claim 1, wherein said hardmask layer has an initial solubility in a base developer prior to said exposing, and said exposed portion of said hardmask layer has a final solubility in a base developer, said final solubility being greater than said initial solubility.

9. The method of claim 1, wherein said nanoparticle comprises a metal selected from the group consisting of silicon, titanium, hafnium, zinc, zirconium, tin, aluminum, cerium, tantalum, vanadium, germanium, cadmium, selenium, oxides, hydroxides, selenides, and sulfides of the foregoing, and combinations thereof.

10. The method of claim 1, said hardmask composition further comprising a vinyl ether crosslinker dispersed or dissolved in said solvent system with said nanoparticle.

11. A composition useful for forming microelectronic devices, said composition comprising:
a non-polymeric nanoparticle dissolved or dispersed in a solvent system,
said composition being developer soluble.

12. The composition of claim 11, wherein said nanoparticle has an average particle size of less than about 15 nm.

13. The composition of claim 11, wherein said nanoparticle comprises a metal selected from the group consisting of silicon, titanium, hafnium, zinc, zirconium, tin, aluminum, cerium, tantalum, vanadium, germanium, cadmium, selenium, oxides, hydroxides, selenides, and sulfides of the foregoing, and combinations thereof.

14. The composition of claim 11, wherein said nanoparticle is selected from the group consisting of colloidal silica, polyhedral oligomeric silsesquioxane molecules, and mixtures thereof.

15. The composition of claim 11, wherein said nanoparticle comprises acid functional groups.

16. The composition of claim 15, wherein said acid groups are selected from the group consisting of hydroxyl groups, carboxyl groups, phenolics, fluoroalcohols, fluoroacrylamides, and mixtures thereof.

17. The composition of claim 11, said composition comprising from about 0.1% to about 5% by weight of said nanoparticle, based upon the total weight of the composition taken as 100% by weight.

18. The composition of claim 11, further comprising a vinyl ether crosslinker dispersed or dissolved in said solvent system with said nanoparticle.

19. The composition of claim 11, said composition further comprising a photoacid generator.

20. A microelectronic structure comprising:
a substrate having a surface;
optionally one or more intermediate layer on said substrate surface; and
a hardmask layer adjacent said intermediate layers, if present, or adjacent said substrate surface if no intermediate layers are present, said hardmask layer comprising a crosslinked non-polymeric nanoparticle and being developer soluble.

21. The structure of claim 20, wherein said nanoparticle is crosslinked with a vinyl ether crosslinker.

22. The structure of claim 20, further comprising an imaging layer adjacent said hardmask layer.

23. The structure of claim 20, wherein said hardmask layer comprises a pattern.

24. The structure of claim 23, wherein said pattern is selected from the group consisting of vias and trenches.

25. The structure of claim 23, further comprising an imaging layer adjacent said patterned hardmask layer.

26. The structure of claim 20, wherein said substrate is selected from the group consisting of silicon, SiGe, $SiO_2$, $Si_3N_4$, aluminum, tungsten, tungsten silicide, gallium arsenide, germanium, tantalum, tantalum nitride, coral, black diamond, phosphorous or boron doped glass, and mixtures of the foregoing.

* * * * *